United States Patent [19]

Gaul et al.

[11] Patent Number: 5,240,876
[45] Date of Patent: Aug. 31, 1993

[54] METHOD OF FABRICATING SOI WAFER WITH SIGE AS AN ETCHBACK FILM IN A BESOI PROCESS

[75] Inventors: Stephen J. Gaul, Melbourne; George V. Rouse, Indialantic, both of Fla.

[73] Assignee: Harris Corporation, Melbourne, Fla.

[21] Appl. No.: 891,910

[22] Filed: Jun. 1, 1992

Related U.S. Application Data

[63] Continuation of Ser. No. 659,553, Feb. 22, 1991, abandoned.

[51] Int. Cl.$^5$ .................................. H01L 21/20
[52] U.S. Cl. ...................... 437/131; 257/63; 257/65; 257/347; 437/21; 437/62; 437/86; 437/974
[58] Field of Search ............ 437/21, 62, 86, 131, 437/974; 148/DIG. 12, DIG. 59, DIG. 135; 257/63, 65, 347

[56] References Cited

U.S. PATENT DOCUMENTS

| | | | |
|---|---|---|---|
| 4,649,627 | 3/1987 | Abernathy et al. | 29/571 |
| 4,861,393 | 8/1989 | Bean et al. | 148/33.4 |
| 4,891,329 | 1/1990 | Reisman et al. | 437/61 |
| 4,962,051 | 10/1990 | Liaw | 437/26 |
| 4,975,387 | 12/1990 | Prokes et al. | 437/131 |
| 5,006,912 | 4/1991 | Smith et al. | 357/34 |
| 5,013,681 | 5/1991 | Godbey et al. | 437/86 |

FOREIGN PATENT DOCUMENTS 3930536 3/1991 Fed. Rep. of Germany ...... 437/131

OTHER PUBLICATIONS

Kimura et al, "Epitaxial film transfer technique for producing single crystal Si film on an insulating substrate", Appl. Phys. Lett. 43(3), Aug. 1, 1983, pp. 263-265.
Haisma et al., "Silicon-on-Insulator Wafer Bonding-Wafer Thinning Technological Evaluations", Jap. J. Appl. Phys. 28(8) (1989) pp. 1426-1443.
Maszara et al., "Bonding of Silicon Wafers for Silicon-on-Insulator", J. Appl. Phys. 64(10) Nov. 15, 1988, pp. 4943-4950.
Suzuki et al., J. Appl. Phys. 54(3) Mar. 1983, pp. 1466-1470.

Primary Examiner—Olik Chaudhuri
Assistant Examiner—Ken Horton
Attorney, Agent, or Firm—Barnes & Thornburg

[57] ABSTRACT

An SOI wafer is formed having a silicon-germanium layer between the epitaxial layer of the device and the insulative layer. The process includes bonding a second substrate to a silicon-germanium layer on a first substrate by an intermediate insulative layer. The first substrate is removed down to the silicon-germanium layer and the silicon layer is epitaxially formed on the silicon-germanium layer.

8 Claims, 2 Drawing Sheets

METHOD OF FABRICATING SOI WAFER WITH SIGE AS AN ETCHBACK FILM IN A BESOI PROCESS

This is a continuation of application Ser. No. 07/659,553, filed Feb. 22, 1991.

BACKGROUND AND SUMMARY OF THE INVENTION

The present invention relates generally to silicon on insulator (SOI) wafers and more specifically to a new method and resulting structure for producing SOI wafers.

Prior art processings for producing silicon on insulator wafers have generally not had the desired thickness control. A typical example of manufacturing is illustrated in FIGS. 1A through 1D. A thin layer of silicon-germanium 12 is formed on a silicon wafer 10. A silicon layer 14 is epitaxially grown on the silicon-germanium layer 12 having an interface at surface 16 and an exposed surface 17. A silicon handle 20 with an insulative layer, for example silicon dioxide 18, is bonded to surface 17 of the epitaxial layer 14. The original wafer 10 is then removed using the silicon-germanium layer 12 as a removal or etch stop. Subsequently, the silicon-germanium layer 12 is removed by etching which also removes a portion of the epitaxial layer 14. Thus the ultimate thickness of the layer 14 is a function of the etching control versus the epitaxial growth control. The resulting surface modified 16' in which the devices are formed has defects resulting from the etching and removal processing steps This is not a fresh virgin surface.

Another common problem with silicon on insulator substrates is that a back channel may be formed along surface 17 since substrate 20 can act as a gate with the insulative layer 18 acting as the gate insulator. As illustrated in FIG. 2 a parasitic back channel can form at the surface 17 which electrically connects the N+ diffusions 22. This is a serious problem in SOI CMOS devices when the thickness of the epitaxial layer 14 is such that the drain and source diffusions of the NMOS devices 'bottom out' onto the buried oxide layer 18. Under conditions where ionizing radiation is present (such as in outer space, for instance) holes trapped in the buried oxide layer 18 can cause a parasitic channel to form at the surface 17 of the NMOS devices leading to circuit failure.

Thus it is an object of the present invention to provide a method for fabricating silicon on insulator wafers with improved thickness control.

It is another object of the present invention to provide silicon on insulator wafers wherein the surface on which devices are formed is of increased quality.

A still further object of the present invention is to provide a silicon on insulator wafer which is less susceptible to bottom channel formation.

These and other objects are achieved by bonding a second substrate to a silicon-germanium layer on a first substrate by an intermediate insulative layer. The first substrate is removed down to the silicon-germanium layer and the silicon layer is epitaxially formed on the silicon-germanium layer. The resulting exposed surface of the epitaxial formed layer is the surface in which the devices are to be formed. Thus the final thickness of the epitaxial layer is a function of epitaxial control and the surface in which the devices are to be prepared is a virgin, untreated surface.

Preferably the silicon-germanium layer is grown using MBE (molecular beam epitaxy) or CVD and has a composition of $Si_{1-x}Ge_x$, with x in the 0.2 to 0.4 range. The first and second substrates may be silicon. The silicon-germanium layer would have a thickness in the range of 100 to 3000 angstroms, the insulative layer would have a thickness range of 1000 angstroms to 4 microns and epitaxial silicon layer would have a thickness in the range of 1000 angstroms to 20 microns.

The resulting structure has the silicon-germanium layer between the epitaxial layer and the insulator. Strain caused by lattice mismatch between silicon and germanium atoms in the silicon-germanium layer lowers the minority carrier lifetime and therefore minimizes the back channel formation when the wafer is used to form CMOS devices.

Other objects, advantages and novel features of the Present invention will become apparent from the following detailed description of the invention when considered in conjunction with the accompanying drawings.

DETAILED DESCRIPTION OF THE DRAWINGS

The layers, portions and regions in FIGS. 3A-3D and 4 having the same or similar purpose and function as that in FIGS. 1A-1D and 2 have the same reference numbers.

Figure 1A:
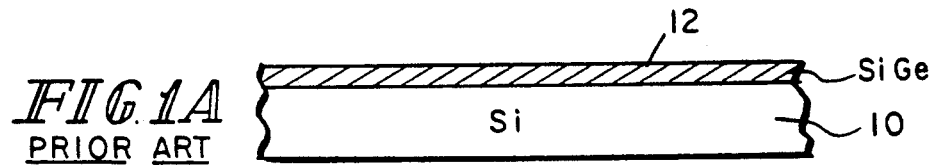
FIGS. 1A-1D show cross-sections of a wafer at various stages of fabrication according to the prior art.
Figure 1B:
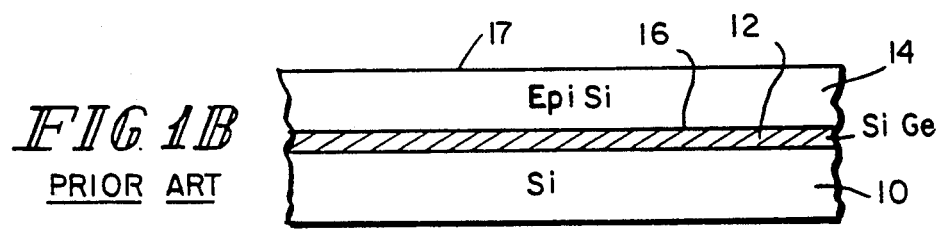
Figure 1C:
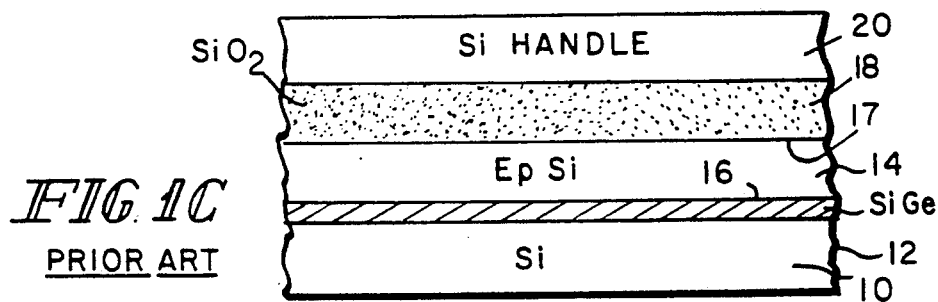
Figure 1D:
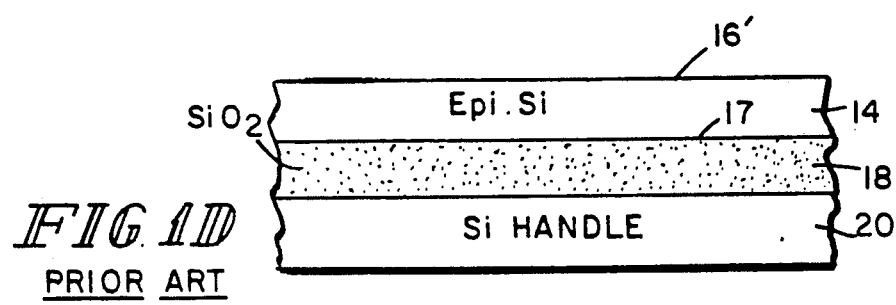
Figure 3A:
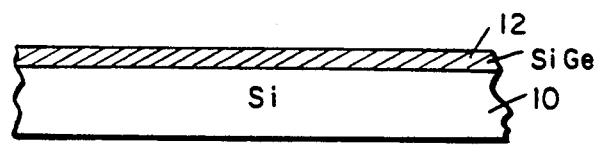
FIGS. 3A-3D show a cross-section of a wafer at various stages of fabrication according to the principles of the present invention.
Figure 3B:
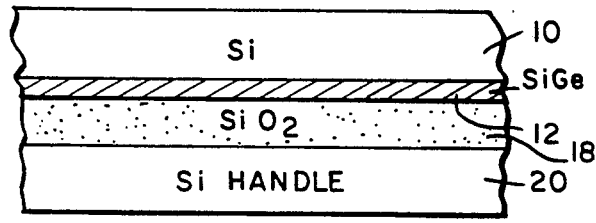
Figure 3C:

A first wafer 10 has a thin layer of silicon-germanium 12 formed thereon by CVD or MBE (molecular beam epitaxy). Step 3A does not differ from step 1A of the prior art. A handle wafer or second substrate 20, which may also be silicon, is bonded to the silicon-germanium layer 12 by an insulative layer 18. Preferably layer 18 is a silicon dioxide layer and the oxygen bonding technique is used. The structure is illustrated in FIG. 3B. The original substrate 10 is then removed down to the silicon-germanium layer 12. For example, layer 10 may be removed by grinding, polishing and etching (using a strain sensitive etch) down to the silicon-germanium layer 12. This leaves the second substrate or handle 20 and the insulative layer 18 with the silicon-germanium layer 12 thereon as illustrated in FIG. 3C.

Figure 3D:
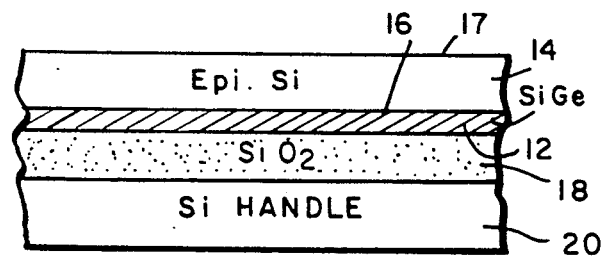
Figure 2:
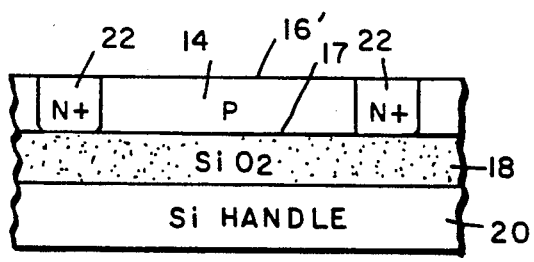
FIG. 2 shows a cross-section of a wafer formed according to the prior art with N+ diffusions in a P type region.

Finally, an epitaxial layer 14 is grown on the silicon-germanium layer 12 using the silicon-germanium layer 12 as a seed. The resulting structure as illustrated in FIG. 3D, includes a top surface 17 in which devices are to be formed and a bottom surface 16 forming an interface between the epitaxial silicon layer 14 and the silicon-germanium layer 12. In comparison to the prior art, the surface 17 of FIG. 3D into which devices are to be built is an untreated surface with a minimum of defects compared to the modified surface 16' of FIG. 1D.

Strain is created by mismatch between silicon and germanium atoms in the silicon-germanium layer 12. This strain has a gettering effect which removes oxygen and metal contaminants from the epitaxial layer 14, producing a denuded zone which can encompass the entire thickness of layer 14. The crystal quality of the epitaxial layer 14 is thereby enhanced. In addition, the strain within the silicon-germanium layer 12 leads to a low minority carrier lifetime in this layer.

Figure 4:
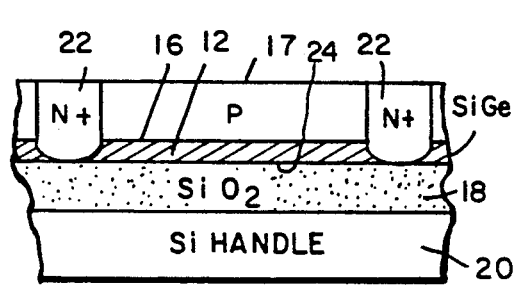
FIG. 4 shows a cross-section of a wafer incorporating the principles of the Present invention including N+ diffusions in a P type region.

Assuming the epitaxial layer 14 is a P type layer (either P type epitaxy or a boron implanted N type epitaxy), N+ type impurities are introduced to form regions 22 down to the insulated layer 18, as in FIG. 4. The N+ regions 22 may represent the drain and source regions of an NMOSFET device, for example. The silicon-germanium layer 12 forming the interface between the insulative layer 18 and the epitaxial layer 14 substantially reduces the formation of a back channel along the surface 24 between the regions 22 due to the low minority carrier lifetime in the silicon-germanium layer 12.

A typical example of dimensions would be the handle 20 having a thickness in the range of 10 to 25 mils, the insulative layer 18 having a thickness in the range of 1000 angstroms to 4 microns, the silicon-germanium layer 12 having a thickness in the range of 100 to 3000 angstroms and the epitaxial layer 14 having a thickness in the range of 1000 angstroms to 20 microns.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. A method of fabricating a silicon on insulator wafer comprising:
   depositing a layer of silicon-germanium on a first substrate;
   bonding a second substrate to said silicon-germanium layer by an intermediate insulative layer;
   removing said first substrate down to said silicon-germanium layer;
   epitaxially forming a silicon layer on said silicon-germanium layer to have an exposed surface into which homojunction devices are to be formed; and
   forming a homojunction device in said epitaxial silicon layer having active regions in said epitaxial silicon layer extending from said exposed surface down to said intermediate insulative layer.

2. A method according to claim 1 wherein said first and second substrates are silicon 3. A method according to claim 1 wherein said silicon-germanium layer is deposited to a thickness in the range of 100 to 3000 angstroms.

4. A method according to claim 1 wherein said insulative layer has a thickness in the range of 1000 angstroms to 4 microns.

5. A method according to claim 1 wherein said silicon layer formed to have a thickness in the range of 1000 angstroms to 20 microns.

6. A method according to claim 1 wherein said silicon-germanium layer is not an active portion of said formed device.

7. A method of fabricating a silicon on insulator wafer comprising:
   depositing a layer of silicon-germanium on a first substrate;
   bonding a second substrate to said silicon-germanium layer by an intermediate insulative layer;
   removing said first substrate down to said silicon-germanium layer;
   epitaxially forming a silicon layer on said silicon-germanium layer to have an exposed surface into which homojunction devices are to be formed; and
   forming a homojunction device in said epitaxial silicon layer having active regions in said epitaxial silicon layer wherein said silicon-germanium layer produces a denuded zone in said epitaxial silicon layer.

8. A method of fabricating a silicon on insulator wafer comprising:
   depositing a layer of silicon-germanium on a first substrate;
   bonding a second substrate to said silicon-germanium layer by an intermediate insulative layer;
   removing said first substrate down to said silicon-germanium layer;
   epitaxially forming a silicon layer on said silicon-germanium layer to have an exposed surface into which homojunction devices are to be formed; and
   forming a homojunction device in said epitaxial silicon layer having active regions in said epitaxial silicon layer wherein said silicon-germanium layer forms a layer of low minority carrier lifetime between said epitaxial silicon layer and said intermediate insulative layer.

* * * * *